United States Patent
Fallah et al.

(10) Patent No.: US 7,573,775 B2
(45) Date of Patent: Aug. 11, 2009

(54) SETTING THRESHOLD VOLTAGES OF CELLS IN A MEMORY BLOCK TO REDUCE LEAKAGE IN THE MEMORY BLOCK

(75) Inventors: Farzan Fallah, San Jose, CA (US); Behnam Amelifard, Los Angeles, CA (US); Massoud Pedram, Beverly Hills, CA (US)

(73) Assignee: Fujitsu Limited, Kanagawa (JP)

( * ) Notice: Subject to any disclaimer, the term of this patent is extended or adjusted under 35 U.S.C. 154(b) by 58 days.

(21) Appl. No.: 11/673,245

(22) Filed: Feb. 9, 2007

(65) Prior Publication Data
US 2007/0195616 A1    Aug. 23, 2007

Related U.S. Application Data

(60) Provisional application No. 60/772,323, filed on Feb. 9, 2006.

(51) Int. Cl.
*G11C 5/14* (2006.01)

(52) U.S. Cl. .................. 365/227; 365/229; 365/194; 365/51; 365/63; 365/156; 365/206; 365/230.06; 365/230.05

(58) Field of Classification Search .......... 365/194, 365/156, 154, 51, 72, 63, 229, 227, 226, 365/206, 230.06, 230.05
See application file for complete search history.

(56) References Cited

U.S. PATENT DOCUMENTS 5,808,956 A * 9/1998 Maruyama ............ 365/230.06
6,163,481 A * 12/2000 Yamada et al. ......... 365/185.11
7,130,236 B2 * 10/2006 Rajwani et al. ............ 365/208

OTHER PUBLICATIONS

Agarwal et al. "A Noise Tolerant Cache Design to Reduce Gate and Sub-Threshold Leakage in the Nanometer Regime," Proc. Int. Symp. Low Power Electronics and Design, Aug. 2003 pp. 18-21.

Agarwal et al., "Leakage in Nano-Scale Technologies, Mechanisms, Impact and Design Considerations," Proc. of Design Automation Conference, 2004, pp. 6-11.

Azizi et al., "Low-Leakage Asymmetric-Cell SRAM," IEEE Trans. on Very Large Scale Integration (VLSI) Systems, vol. 11, No. 4, Aug. 2003, pp. 701-715.

Bhavnagarwala et al., "A Pico-Joule Class, 1 GHz, 32 KByte x 64b DSP SRAM with Self Reversed Bias," Symp. VLSI Circuits Dig. Tech. Papers, Jun. 2003, pp. 251-252.

Bhavnagarwala et al., "The Impact of Intrinsic Device Fluctuations on CMOS SRAM Cell Stability," IEEE J. Solid-State Circuits, vol. 36, No. 4, Apr. 2001, pp. 658-665.

(Continued)

*Primary Examiner*—Andrew Q Tran
(74) *Attorney, Agent, or Firm*—Baker Botts L.L.P.

(57) ABSTRACT

In one embodiment, a memory block includes one or more bit lines that each include two or more cells. Each cell in each bit line has a distance from a sense amplifier coupled to the bit line, and each of one or more of the cells in each of one or more of the bit lines has a delay particularly set according to the distance of the cell from the sense amplifier coupled to the bit line.

14 Claims, 2 Drawing Sheets

OTHER PUBLICATIONS

De et al., "Techniques for Leakage Power Reduction," Design of High-Performance Microprocessor Circuit, Circuits, IEEE, 2001, Chapter 3, pp. 46-62.

Hamzaoglu et al., "Circuit-Level Techniques to Control Gate Leakage for Sub-100nm CMOS," Proc. Int. Symp. Low Power Electronics and Design, Aug. 2002, pp. 60-63.

Hamzaoglu et al., "Dual Vt-SRAM Cells with Full-Swing Singe-Ended Bit Line Sensing for High-Performance On-Chip Cache in 0.13um Technology Generation," Proc. Int. Symp. Low Power Electronics Design, Jul. 2000, pp. 15-19.

Kim et al., "A Forward Body-Biased Low-Leakage SRAM Cache: Device, Circuit and Architecture Considerations," IEEE Trans. on Very Large Scale Integration (VSLI) Systems, vol. 13, No. 3 Mar. 2005, pp. 349-357.

Kim et al., "Dynamic Vt SRAM: A Leakage Tolerant Cache Memory for Low Voltage Microprocessors," Proc. Int. Symp. Low Power Electronics Design, Aug. 2002, pp. 251-254.

Lee et al., "Gate Oxide Leakage Current Analysis and Reduction for VLSI Circuits," IEEE Trans. on Very Large Scale Integration (VLSI) Systems, vol. 12, No. 2, Feb. 2004, pp. 155-166.

Molina et al., "Non Redundant Data Cache," Proc. Int. Symp. Low Power Electronics and Design, Aug. 2003, pp. 274-277.

Preston et al., "Register Files and Caches," Design of High-Performance Microprocessor Circuits, IEEE, 2001, pp. 285-308.

Qin et al., "SRAM Leakage Suppression by Minimizing Standby Supply Voltage," Proc. Int. Symp. on Quality Electronic Design, Mar. 2004, 6 pages.

Sultania et al., "Tradeoffs Between Gate Oxide Leakage and Delay for Dual Tox Circuits," Proc. Design Automation Conf., 2004, pp. 761-766.

Sirisantana et al., "High Performance Low-Power CMOS Circuits Using Multiple Channel Length and Multiple Oxide Thickness," Proc. Int. Conf. on Computer Design: VLSI in Computers and Processors, 2000, pp. 227-232.

Sirvastava, A., "Simultaneous Vt Selection and Assignment for Leakage Optimization," Proc. Int. Symp. on Low Power Electronics Design, Aug. 2003, pp. 146-151.

Taur, Y., "CMOS Scaling and Issues in Sub-0.25 um Systems," Design of High-Performance Microprocessor Circuits, IEEE, 2001, pp. 27-45.

Togo et al., "Multiple Thickness Gate Oxide and Dual-Gate Technologies for High-Performance Logic Embedded DRAMs," IEDM Tech. Dig., 1998, pp. 347-350.

Wei et al., "Mixed-Vth (MVT) CMOS Circuit Design Methodology for Lower Power Applications," Proc. Design Automation Conference, 1999, pp. 430-435.

Weiss et al., "The On-Chip 3MB Subarray Based 3rd Level Cache on an Itanium Microprocessor," Int. Solid-State Circuits Conf. Dig. Tech. Papers, Feb. 2002, pp. 112-113.

Zhang et al., "SRAM Design on 65-nm CMOS Technology with Dynamic Sleep Transistor for Leakage Reduction," IEEE J. Solid-State Circuits, vol. 40, No. 4, Apr. 2005, pp. 895-901.

Zhang et al., "A 3-GHz 70Mb SRAM in 65nm CMOS Technology with Integrated Column-Based Dynamic Power Supply," Int. Solid-State Circuits Conf. Dig. Tech. Papers, Feb. 2005, pp. 474-475.

http://www.device.eecs.berkeley.edu/~bsim3/bsim4.html, 1 page, 1997, Printed Apr. 23, 2007.

http://synopsys.com/products/mixedsignal/hspice/hspice.html, 3 pages, Printed Apr. 23, 2007.

* cited by examiner

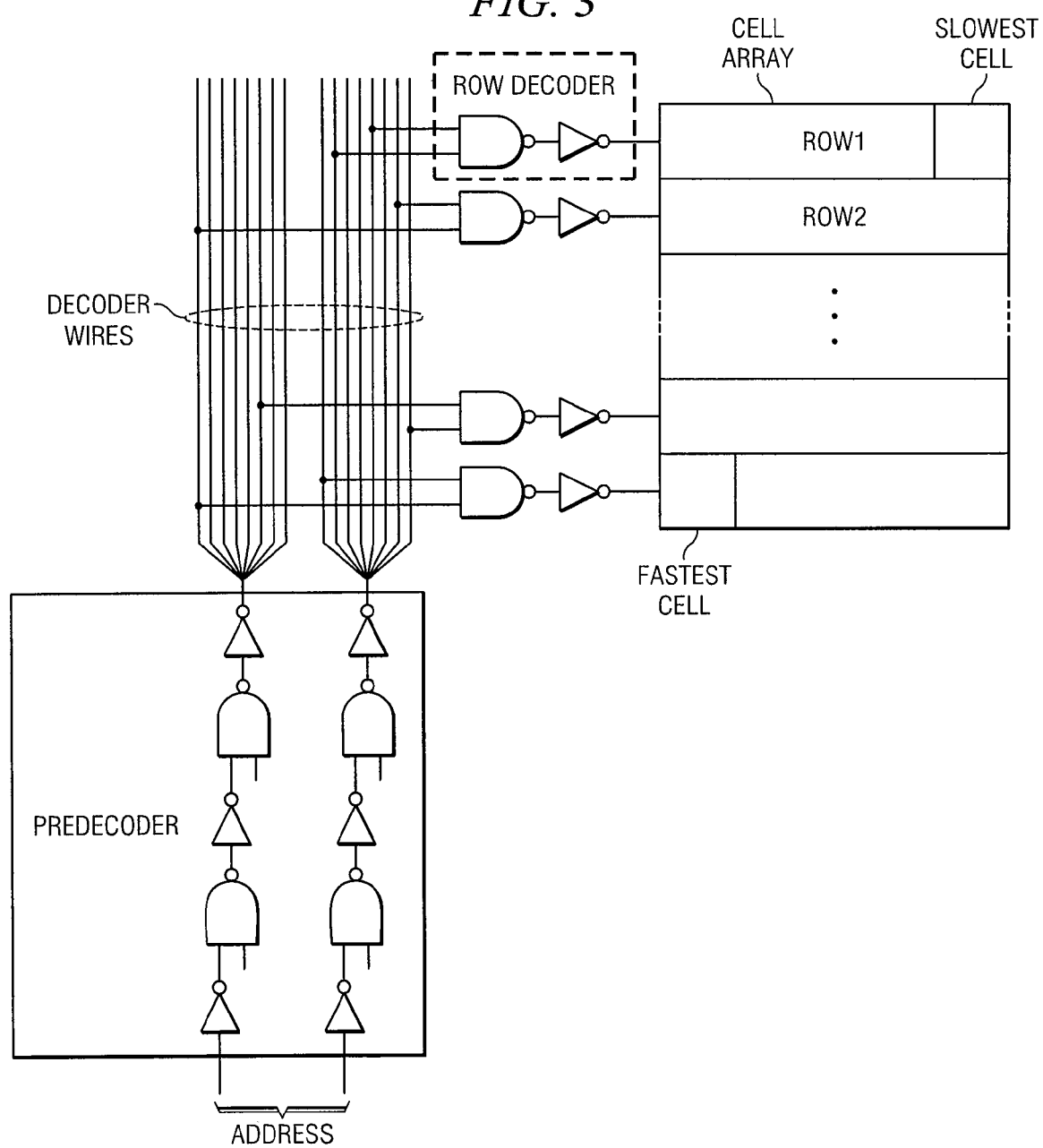

SETTING THRESHOLD VOLTAGES OF CELLS IN A MEMORY BLOCK TO REDUCE LEAKAGE IN THE MEMORY BLOCK

RELATED APPLICATION

This Application claims the benefit, under 35 U.S.C. §119(e), of Provisional Patent Application No. 60/772,323, which is incorporated herein by reference.

TECHNICAL FIELD

The present disclosure relates generally to memory devices.

BACKGROUND

Due to technology scaling, reducing leakage power dissipation is an important factor in the design of very large-scale integration (VLSI) systems. The leakage power dissipation is roughly proportional to the area of a circuit. In many processors, caches occupy about 50% of the chip area. Therefore, the static power dissipation of a cache is an important component of the power dissipation in microprocessors.

BRIEF DESCRIPTION OF THE DRAWINGS

FIG. 3 illustrates an example memory block with an example decoder.

DESCRIPTION OF EXAMPLE EMBODIMENTS

Particular embodiments facilitate low-power memory (such, for example, static random access memory (SRAM)) design based on using different types of cells with different threshold voltage assignments. Due to the non-zero delay of interconnects, different memory cells in a memory array have different read and write delays. Therefore, leakage power consumption may be reduced by using a high threshold voltage for some transistors. Particular embodiments provide one or more of the following advantages over previous techniques for low-power memory design: reduced or no hardware overhead; reduced or no delay overhead; no significant changes in typical memory design processes required; or improvement in static noise margin (SNM) under process variation.

Figure 1:
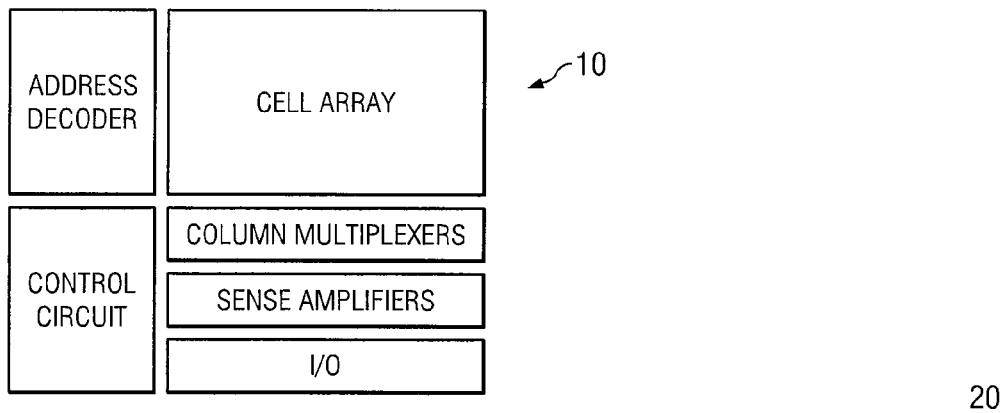
FIG. 1 illustrates an example memory block.
Figure 2:
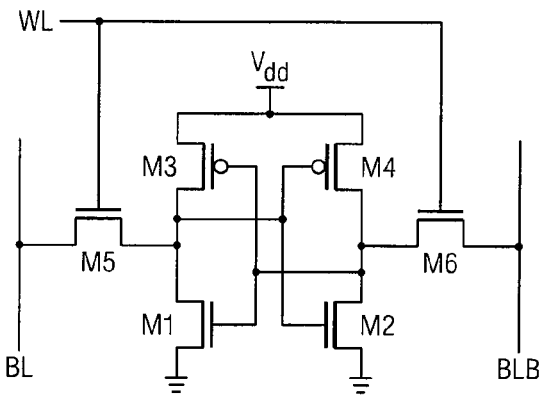
FIG. 2 illustrates an example cell in a memory block.

FIG. 1 illustrates an example memory block 10. In particular embodiments, Memory block 10 is an SRAM block. Memory block 10 includes one or more cell arrays, one or more address decoders, one or more column multiplexers, one or more sense amplifiers, input and output (I/O), and control circuitry. In particular embodiments, the functionality of the control circuit is to generate internal signals for memory block 10. FIG. 2 illustrates an example cell 20 in a memory cell array in memory block 10. Cell 20 includes six transistors (6T). A bit value stored in cell 20 is preserved as long as cell 20 is connected to a supply voltage that has a value greater than the data retention voltage (DRV) of cell 20. This feature, which is typically due to the presence of cross-coupled inverters inside cell 20, is largely independent of the amount of leakage current. Traditionally, all cells 20 in a memory block 10 are identical, e.g., they have the same width and the same threshold voltage, which results in identical leakage characteristics for all the cells in the memory block. However, by using nonidentical cells, but with the same layout footprint, particular embodiments achieve more power-efficient designs.

The present invention encompasses all suitable types of memory, where appropriate. As an example and not by way of limitation, particular embodiments encompass SRAM, ferroelectric random access memory (FRAM), read only memory (ROM), programmable read only memory (PROM), erasable programmable read only memory (EPROM), electrically erasable programmable read only memory (EEPROM), flash memory, dynamic random access memory (DRAM), magnetic random access memory (MRAM), phase change random access memory (PRAM), non volatile random access memory (NVRAM), bubble memory, ovonic unified memory (OUM), nanotube memory, molecular memory, programmable logic device (PLD), electrically programmable logic device (EPLD), generic array logic device (GAL), programmable logic array (PLA), programmable array logic (PAL), a three dimensional memory structure, content addressable memory (CAM), or a register file or a combination of two or more such types of memory. Herein reference to a memory block encompasses a memory block of any suitable memory type. Similarly, reference herein to a cell of a memory block encompasses a cell of any suitable memory type.

In particular embodiments, there are two dominant leakage paths in cell 20: $V_{dd}$-to-ground paths inside cell 20; and bit line-to-ground paths through pass transistors in cell 20. To reduce the first type of leakage, the threshold voltages of the pull-down n-type metal-oxide semiconductor (NMOS) transistors, pull-up p-type metal-oxide semiconductor (PMOS) transistors, or both may be increased. To reduce the second type of leakage, the threshold voltages of the pull-down NMOS transistors, pass transistors, or both may be increased.

In particular embodiments, a memory block 10 includes more than one cell array. FIG. 1 illustrates one cell array. The size of the cell array may depend on performance and density requirements. In general, as technology shrinks, cell arrays tend to move from taller to wider structures. However, since using wider cell arrays tends to require more circuitry for column multiplexers and sense amplifiers. When large area overhead is unacceptable, e.g., large L3 caches, the number of rows may still be high.

Although the logical function of an address decoder is relatively simple, in practice, designing an address is relatively complicated, because the address decoder should interface the cells in the cell array, and pitch matching with the cell array is often difficult. To facilitate overcoming the pitch-matching problem and reduce the effect of wire capacitance on the delay of the address decoder, the address decoder may be broken into two pieces in particular embodiments. The first piece, called a predecoder, is placed before long decoder wires and the second part, called a row decoder, which may include a single NAND gate and buffers for driving the word-line capacitance, is pitch-matched and placed next to each row as illustrated in FIG. 3, which illustrates an example memory block 10 with an example decoder.

In particular embodiments, column multiplexing is desirable because it reduces the number of rows in the cell array and, as a result, increases the speed of the cell array. Since bit or bit-bar line discharges approximately 200 mV during a read operation, a sense amplifier may be used to sense a small voltage difference and generate a digital value.

In particular embodiments, due to the non-zero delay of the interconnects of the address decoder, word-lines, bit-lines, and the column multiplexer, read delay and write delay of cells in a memory block are differ from each other. As an example and not by way of limitation, for a typical memory block, the read time of the cell closest to the address decoder and the column multiplexer is approximately 5% to 10% less than the read time of the cell farthest from the address decoder, as illustrated in FIG. 3. This difference presents an opportunity to reduce the leakage power consumption of the memory block by increasing the threshold voltage of some of the transistors in the cells in the memory block.

On the other hand, in particular embodiments, possibly due to the delay of sense amplifiers and output buffers in a read path, the write delay of a cell is typically less than its read delay. Since increasing the threshold voltage of the PMOS transistors in a 6T cell increases the write delay of the cell, but has little effect on the read delay of the cell, increasing the threshold voltage of the PMOS transistors may reduce leakage power consumption, as long as the write time of the cell is less than a particular value.

In particular embodiments, each additional threshold voltage may require one more mask layers in the fabrication process, which may increase fabrication costs. At the same time, the benefits of having more than two threshold voltages may be relatively small. As a result, in many cases, only two threshold voltages are utilized. So, particular embodiments tend to focus on the problem of low-leakage memory design when only two threshold voltages are available. However, it is possible to extend the results to handle more than two threshold voltages. Accordingly, particular embodiments accommodate more than two threshold voltages.

In particular embodiments, to reduce the leakage power consumption of a cell, the threshold voltage of all or some of the transistors of the cell may be increased. If the threshold voltage of all transistors in a cell is increased, the leakage reduction may be at a high level; however since this scenario may have an adverse effect on the read delay of the cell, the number of replaceable cells is relatively small. Thus, particular embodiments take into consideration other configurations that have smaller leakage reductions due to their lower delay overheads.

Particular embodiments use a symmetric cell configuration, which means the symmetric transistors within a cell have the same threshold voltages. Thus, in such embodiments, there are eight different possibilities for assigning high and low threshold voltages to the transistors within a cell. TABLE 1 illustrates eight example configurations assigning high threshold voltages and low threshold voltages to transistors in a cell:

TABLE 1

| Configuration | High threshold transistors |
| --- | --- |
| C0 | None |
| C1 | M1, M2, M3, M4, M5, M6 |
| C2 | M3, M4, M5, M6 |
| C3 | M1, M2, M5, M6 |
| C4 | M1, M2, M3, M4 |
| C5 | M5, M6 |
| C6 | M3, M4 |
| C7 | M1, M2 |

The configurations may assume that the threshold voltage of each transistor in the cell is adjustable independent of other threshold voltages by changing the channel doping. In particular embodiments, such an assumption is relatively safe, because in a cell the channels of the transistors are far enough away from each other. However, using only one threshold voltage in the cell may provide considerable power reduction. In TABLE 1, moving from C1 to C7 monotonically decreases the leakage current savings. Different configurations have different effects on read and write delays of the cells. The increase in read delay for some configurations (such as, for example, C1 and C3) may be relatively high. The increase in read delay may be relatively small for other configurations (such as, for example, C6) is relatively low. Moreover, not all configurations necessarily increase write time; for example, C4 and C7 may decrease write time.

In particular embodiments, the SNM of a complementary metal-oxide semiconductor (CMOS) cell is the minimum direct current (DC) noise voltage necessary to flip the state of the cell. Cells are relatively sensitive to noise during a read operation because the "0" storage node rises to a voltage higher than ground due to a voltage division along the pull-down NMOS transistor and the pass transistor. If the voltage rises high enough, the voltage may change the value of the cell. Generally, in particular embodiments, using high-threshold transistors in the cells tends to increase SNM. The SNM of each configuration is measurable under two scenarios: nominal condition and process variation. In particular embodiments, for all configurations except C6 (when only PMOS transistors are high threshold) the nominal SNM may be more than that of C0 and may improve as the high threshold voltage increases. The SNM of C6 may be slightly less than the SNM of C0 and may degrade as the high threshold voltage increases.

To design a hybrid-cell memory block, particular embodiments determine the slowest read and write delay starting with all low threshold-voltage cells, which is C0. Next, since C1 results in the highest leakage reduction among all the configurations, particular embodiments replace as many C0 cells as possible with C1 cells in such a way that the access delay of the replaced cells will not be larger than the slowest access delay. After that, particular embodiments try to replace the remaining C0 cells with C2, C3, C4, C5, C6, and C7 cells, as appropriate.

The following example pseudo code demonstrates example cell assignment in particular embodiments:

```
Hybrid-Cell-Assignment (rownum, colnum, v_{tH_lb}, v_{tH_ub})
0.  Begin
1.    T_max=ReadDelay (colnum-1, rownum-1, C0)
2.    For v_{t,high}= v_{tH_lb} to v_{tH_ub}
3.      For config=C1 to C7
4.        For (0≤col<colnum, 0≤row<rownum)
5.          flag[config][col,row]=1;
6.        Endfor
7.      Endfor
8.      For col=0 to colnum-1
9.        For row=0 to rownum-1
10.         For config=C1 to C7
11.           If (flag[config][col,row] ==1)
12.             If (ReadDelay(col,row,config)<T_max
                  && WriteDelay(col,row,config)<T_max)
13.               Replace cell[col][row] with config; Break;
14.             Else
15.               For (i≥col,j≥row)
16.                 flag[config][i,j]=0;
17.               Endfor
18.             Endif
19.           Endif
20.         Endfor
21.       Endfor
22.     Endfor
23.   Endfor
24. End
```

In the pseudo code above, rownum and colnum represent the number of rows and columns of the memory block, respectively, and $V_{th\_lb}$ and $V_{tH\_ub}$ represent the lower and upper bounds of the high threshold value, respectively. Index [0, 0] denotes the fastest cell. Index [colnum−1, rownum−1] denotes the slowest cell. ReadDelay(col,.row,.config) and WriteDelay(col,.row,.config) are two subroutines that return the read and write delays of cell [col, row] when configuration config is used. If cell [col, row] fails working with configuration config, then all cells [i, j], where i≧col and j≧row, fail with the same configuration. Therefore, a relatively large number of cells may be pruned as soon as a cell fail to work for a particular configuration. In the pseudo code above, flag[config][col, row] is a flag that indicates whether cell[col, row] may work with configuration config. Initially all flags are set to 1. In particular embodiments the algorithm described above results in a significant power reduction in memory blocks.

To speed up the process, instead of checking for possible replacement on each single cell, particular embodiments may select n×n memory blocks and check for the slowest cell in the memory block. If the slowest cell passed the delay test, the whole memory block would be replaced. Otherwise, a next configuration or memory block is examined. Here, n represents a multiple of two. In particular embodiments, choosing a larger number for n decreases the design time, but degrades the result.

Particular embodiments facilitate low-leakage memory design. At least some such embodiments are based on the fact that, due to the non-zero delay of interconnects of the address decoder, word-line, bit-line and the column multiplexer, different cells of a memory have different access delays; thus, the threshold voltage of some transistors of cells may be increased without degrading the performance. By using eight different configurations for the cells, particular embodiments achieve a low-leakage memory block without sacrificing performance and area. Moreover, particular embodiments improve SNM under process variation. By applying this technique to a 64 Kb memory block, particular embodiments may achieve more than 35% reduction in the leakage-power dissipation.

CMOS scaling at less than approximately 100 nm typically requires both low threshold voltages to retain device switching speeds and thin gate oxides to maintain current drive and keep threshold voltage variations under control when dealing with short-channel effects. Low threshold voltage often causes subthreshold leakage current to exponentially increase, whereas thin oxide often causes gate leakage current to exponentially increase. The leakage power dissipation may be approximately proportional to the area of the circuit. Since, in many processors, caches occupy approximately half the area of the chip, the leakage power of caches is often a significant source of power consumption in microprocessors.

Using higher threshold voltages tends to reduces subthreshold leakage, but, to reduce gate leakage, multiple oxide thickness is often necessary. There are different ways to achieve higher threshold voltage. One way to achieve higher threshold voltage is to adjust the channel doping concentration and apply a body bias. On the other hand, implanting arsenic into the silicon substrate before thermal oxidation may achieve multiple oxide thickness.

Particular embodiments provide one or more of the following advantages over previous techniques for reducing leakage current in memory blocks: reducing both subthreshold and gate tunneling leakage current; reduced or no hardware overhead; reduced or no delay overhead; no significant changes in memory design flow required; or improvement in SNM under process variation.

As described above, FIG. 1 illustrates an example memory block 10. Memory block 10 includes one or more cell arrays, one or more address decoders, one or more column multiplexers, one or more sense amplifiers, input and output (I/O), and control circuitry. As further described above, FIG. 2 illustrates an example cell 20 in a cell array in memory block 10. Cell 20 includes six transistors (6T). A bit value stored in cell 20 is preserved as long as cell 20 is connected to a supply voltage that has a value greater than the data retention voltage (DRV) of cell 20. This feature, which is typically due to the presence of cross-coupled inverters inside cell 20, is largely independent of the amount of leakage current. In cell 20, the pull-down NMOS transistors and the pass transistors reside in the read path. To achieve high read stability, the pull down transistors should usually be stronger than the pass transistors. The pull-up PMOS transistors and the pass-transistors, on the other hand, are in the write path. Although using strong PMOS transistors usually improves read stability, strong PMOS transistors tend to degrade the write-margin of cell 20. Properly sizing pass transistors facilitates an adequate write margin.

The leakage current of a deep submicron CMOS transistor typically has three major components: (1) junction tunneling current; (2) subthreshold current; and (3) gate tunneling current.

Reverse-biased p-n junction leakage has two main components: (1) minority carriers' diffusion near the edge of the depletion region; and (2) electron-hole pair generation in the depletion region of the reverse-biased junction. Junction tunneling current is usually an exponential function of junction doping and reverse bias voltage across the junction. Since junction tunneling current contributes relatively little to total leakage current, particular embodiments do not attempt to reduce this component of leakage in a cell; however, applying a forward substrate biasing may reduce junction tunneling current.

Subthreshold leakage is the drain-source current of a transistor when the gate-source voltage is less than the threshold voltage. More precisely, subthreshold leakage occurs when the transistor is operating in the weak inversion region. Subthreshold current depends exponentially on threshold voltage, which results in large subthreshold current in short channel devices. Increasing the threshold voltage of all or some of the transistors in a cell may reduce the subthreshold leakage of the cell. However, a drawback of increasing the threshold voltage of all or some of the transistors in a cell is an increase in the read delay of the cell, the write delay of the cell, or both. If the threshold voltage of the pull-up PMOS transistors in the cell is increased, the write delay increases, whereas the effect on the read delay is more or less negligible. On the other hand, if the threshold voltage of the pull-down NMOS transistors is increased, the read delay increases, whereas the effect on the write delay is relatively marginal. By increasing the threshold voltage of the pass transistors in the cell, both the read delay and the write delay increase. Due to the delay of sense amplifiers and output buffers in a read path, the write delay of a cell tends to be smaller than its read delay. Therefore, increasing the threshold voltage of the PMOS transistors in the cell may effectively reduce the subthreshold leakage as long as the write delay is less than the read delay.

Figure 4:
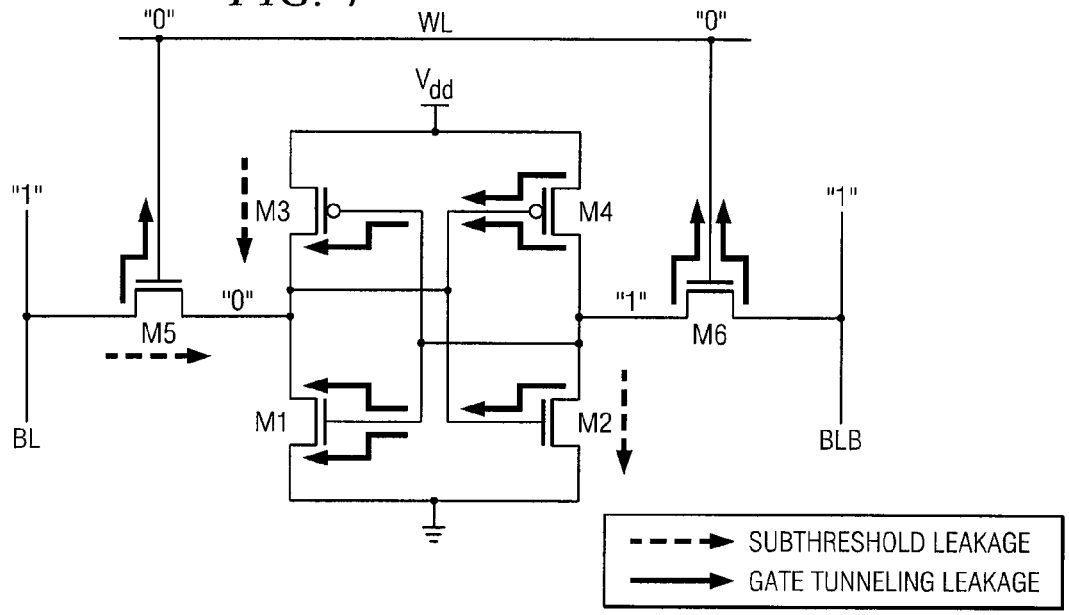
FIG. 4 illustrates an example subthreshold and gate tunneling leakage in a cell storing a "0".

Electrons (holes) tunneling from the bulk silicon through the gate oxide into the gate typically results in gate tunneling current in an NMOS or PMOS transistor. Gate tunneling current usually has three major components: (1) gate-to-source and gate-to-drain overlap current, (2) gate-to-channel current, part of which goes to source and the rest goes to drain, and (3) gate-to-substrate current. In bulk CMOS technology, gate-to-substrate leakage current is often several orders of magnitude lower than overlap tunneling current and gate-tochannel current. On the other hand, while overlap tunneling current tends to dominate gate leakage in the OFF state, gate-to-channel tunneling typically dictates gate current in the ON condition. Since gate-to-source and gate-to-drain overlap regions are usually smaller than the channel region, gate tunneling current in the OFF state is usually smaller than gate tunneling in the ON state. If $SiO_2$ is used for the gate oxide, PMOS transistors will have about one order of magnitude smaller gate leakage than NMOS transistors. Therefore, in a cell, the power saving achieved by increasing the oxide thickness of the PMOS transistors is usually relatively marginal. FIG. 4 illustrates an example subthreshold and gate tunneling leakage in a cell storing a "0."

Because of the non-zero delay of the interconnects of the address decoder, word-lines, bit-lines, and the column multiplexer, read delays and write delays of cells in a memory block differ from each other. In particular embodiments, for a typical memory block, depending on the number of rows and the number of columns, the read time of the cell closest to the address decoder and the column multiplexer may be approximately 5% to 15% less than the read time of the cell farthest from the address decoder and the column multiplexer. This phenomenon enables reduction of leakage power consumption of a memory block by increasing the threshold voltage or oxide thickness of particular transistors of the cells in the memory block.

In particular embodiments, each additional threshold voltage or oxide thickness may necessitate an additional mask layer during fabrication, which may increase fabrication costs. As a result, in many cases, only two threshold voltages and two different oxide thicknesses are utilized in the circuit. Particular embodiments address low-leakage memory design in the context of dual-$V_t$ and dual-$T_{ox}$ technology. However, embodiments of the present invention contemplate more than two threshold voltages and two oxide thicknesses, where appropriate.

Particular embodiments changes the read delay, the write delay, or both of each of one or more cells in a memory block 10 by, for example, increasing the length of each of one or more transistors in the cell, reducing the supply voltage of the cell, increasing the ground voltage of the cell, increasing the back bias voltage of the cell, changing the width of each of one or more transistors in the cell, or increasing the thickness of the gate oxide of each of one or more transistors in the cell (which reduces gate tunneling leakage), or employing a combination of two or more such techniques.

To reduce the subthreshold leakage power consumption of a cell, particular embodiments increase the threshold voltage of all or some of the transistors of the cell. Increasing the threshold voltages of all transistors in the cell will yield the greatest reduction in subthreshold leakage. However, since increasing the threshold voltages of all transistors in the cell tends to have the worst effect on read delay, particular embodiments should change only relatively few cells. Thus, particular embodiments take into consideration other configurations providing less subthreshold leakage reduction, but lower delay penalties. On the other hand, as described above, to reduce gate tunneling leakage of a cell, only the oxide thickness of the pull-down NMOS transistors and pass transistors need be increased. Although this is seemingly desirable from a low-power point of view, it is not applicable for all cells in the cell array; thin oxide should be used in the cells far from the address decoder and sense amplifiers. Increasing oxide thickness also increases threshold voltage, which decreases subthreshold leakage. Herein, where appropriate, reference to high $V_t$ transistors encompasses transistors having threshold voltages modified by, for example, increasing channel doping, but not transistors having threshold voltages boosted by increasing oxide thickness. To make the cells more readily manufacturable, particular embodiments use a symmetric cell configuration according to which symmetrically located transistors in a cell have approximately the same threshold voltages and oxide thicknesses. Thus, there are thirty-two configurations for assigning high and low threshold voltages and oxide thickness to transistors in a cell. Since increasing the oxide thickness of a transistor also increases the threshold voltage of the transistor, to avoid high delay penalties, particular embodiments do not increase the oxide thickness and the threshold voltage of a transistor at the same time. Therefore, the number of configurations drops to eighteen (there are two choices for the pair of PMOS transistors and three choices for each of the pull-down NMOS pair and pass transistor pair).

Each configuration has a different effect on read and write delays of cells. Simulating the configurations may facilitate elimination of the dominated configurations, e.g., the configurations having higher leakage and longer read and write delay than one or more other configurations. As an example and not by way of limitation, referring back to FIG. 2, in a first configuration, M1, M2, M5, and M6 are high $T_{ox}$ transistors and M3 and M4 are high $V_t$ transistors. In a second configuration, M1 and M2 are high $T_{ox}$ transistors and M3, M4, M5, and M6 are high $V_t$ transistors. In a third configuration, M1 and M2 are high $T_{ox}$ transistors, M3 and M4 are high $V_t$ transistors, and M5 and M6 are neither high $T_{ox}$ transistors or high $V_t$ transistors. In a fourth configuration, M1, M2, M3 and M4 are high $V_t$ transistors and M5 and M6 are neither high $T_{ox}$ transistors or high $V_t$ transistors. In a fifth configuration, M3 and M4 are high $V_t$ transistors and M1, M2, M5, and M6 are neither high $T_{ox}$ transistors or high $V_t$ transistors. In particular embodiments, compared with an initial configuration where all transistors in the cell are low $T_{ox}$ and low $V_t$ transistors, i.e., all threshold voltages are relatively low and all oxide thicknesses are relatively thin, the first configuration achieves a leakage power reduction of approximately 90%; the second configuration achieves a leakage power reduction of approximately 75%; the third configuration achieves a leakage power reduction of approximately 50%; the fourth configuration achieves a leakage power reduction of approximately 40%; and the fifth configuration achieves a leakage power reduction of approximately 15%. In particular embodiments, compared with the same initial configuration, the first configuration results in an approximately 8% increase in read delay; the second configuration results in an approximately 5% increase in read delay; the third configuration results in an approximately 1.5% increase in read delay; the fourth configuration results in an approximately 1% increase in read delay; and the fifth configuration results in a more or less negligible increase in read delay.

In particular embodiments, the SNM of a CMOS SRAM cell is the minimum DC noise voltage needed to flip the state of a cell. SRAM cells are particularly sensitive to noise during a read operation because the "0" storage node rises to a voltage higher than ground due to a resistive voltage divider that includes the pull-down NMOS transistor and the pass transistor. If the voltage is high enough, the voltage may change the value of the cell.

Starting from a predesigned SRAM with all low $V_t$ and low $T_{ox}$ cells (such as, for example, C0) to design a hybrid-cell SRAM, particular embodiments identify the slowest read and write delays. Next, considering the layout of memory block 10 in FIG. 1 and the fact that C1 has the lowest leakage power consumption among all the configurations, particular embodiments replace as many C0 cells as possible with C1 cells in such a way that the access delay of the replaced cells is no larger than the slowest access delay in the original design of memory block 10. Particular embodiments then try to replace the remaining C0 cells with other configurations in descending order of leakage saving, e.g., C2, C3, and C4. Since modifying $V_t$ and $T_{ox}$ does not significantly change the footprint of a cell, the hybrid cell assignment does not significantly change the layout of the cell array in memory block 10 and may be performed without significantly affecting the overall floor plan of the module including memory block 10.

Using C1 cells (which have pass transistors with thick gate oxides) decreases the word-line and (to some extent) the bit-line capacitances, and thereby reduces word-line delay and bit-line delay. If the control signals of memory block 10 (such as, for example, pre-charge, read-mux, write-mux, and sense-enable) have not been properly designed, e.g., they cannot tolerate the decrease in delay, the control circuitry may be modified to accommodate the decrease. In particular embodiments, minor modifications will suffice to accommodate the decrease.

Particular embodiments facilitate low-leakage SRAM design. At least some such embodiments rely on the fact that, due to the non-zero delay of interconnects of the address decoder, the word-lines, the bit-lines, and the column multiplexers, the cells of a memory block 10 have access delays that differ from each other. Thus, the threshold voltage or the gate-oxide thickness of particular transistors of particular cells may be increased without degrading performance. By using five different configurations for the cells, particular embodiments achieve a low-leakage memory block 10 without sacrificing performance or area. In particular embodiments, by applying the proposed technique to a 64 Kb SRAM in a 65 nm technology node, the total leakage power dissipation of the SRAM may be reduced by up to approximately 53.5%.

The present disclosure encompasses all changes, substitutions, variations, alterations, and modifications to the example embodiments described herein that a person having ordinary skill in the art would comprehend. Similarly, where appropriate, the appended claims encompass all changes, substitutions, variations, alterations, and modifications to the example embodiments described herein that a person having ordinary skill in the art would comprehend.

What is claimed is:

1. A memory block comprising:
   a sense amplifier;
   an address decoder; and
   an array of memory cells coupled to the sense amplifier and the address decoder;
   each memory cell comprising one or more transistors and having a first connection distance from the sense amplifier and a second connection distance from the address decoder, each transistor of the memory cell having a threshold voltage affecting an access delay and a leakage power consumption of the memory cell;
   each of one or more transistors of each of one or more memory cells having its threshold voltage set based on its first connection distance or its second connection distance specifically to enable both:
      reduction of the leakage power consumption of the memory cell; and
      maintenance of the access delay of the memory cell below a predetermined threshold.

2. The memory block of claim 1, wherein the access delay comprises a read delay, a write delay, or both.

3. The memory block of claim 1, wherein the setting of the threshold voltage of a particular memory cell further enables a reduction of the dynamic power consumption of the memory cell.

4. The memory block of claim 1 wherein the setting of the threshold voltage of a particular memory cell further enables a reduction of the static noise margin of the memory cell.

5. The memory block of claim 1, wherein the setting of the threshold voltage of a particular memory cell further enables an increase of a read stability of the memory cell.

6. The memory block of claim 1, wherein the setting of the threshold voltage of a particular memory cell further enables a reduction of a capacitive load on the bit line connected to the memory cell.

7. The memory block of claim 1, wherein:
   the memory block further comprises a predecoder;
   each memory cell has a third connection distance from the predecoder; and
   each of one or more transistors of each of one or more memory cells has its threshold voltage set further based on its third connection distance.

8. The memory block of claim 1, wherein the memory block comprises one or more of:
   static random access memory (SRAM);
   ferroelectric random access memory (FRAM);
   read only memory (ROM);
   programmable read only memory (PROM);
   erasable programmable read only memory (EPROM);
   electrically erasable programmable read only memory (EEPROM);
   flash memory;
   dynamic random access memory (DRAM);
   magnetic random access memory (MRAM);
   phase change random access memory (PRAM);
   non volatile random access memory (NVRAM);
   bubble memory;
   ovonic unified memory (OUM);
   nanotube memory;
   molecular memory;
   programmable logic device (PLD);
   electrically programmable logic device (EPLD);
   generic array logic device (GAL);
   programmable logic array (PLA);
   programmable away logic (PAL);
   a three dimensional memory structure;
   content addressable memory (CAM); or
   a register file.

9. The memory block of claim 1,
   wherein each of one or more transistors of each of one or more memory cells having its threshold voltage set comprises the transistor having one or more of its channel length, channel width, or gate oxide thickness set based on its first connection distance or its second connection distance without causing a footprint of the memory cell to differ from one or more other memory cells not having any of the threshold voltage of any of its transistors set based on its first connection distance or its second connection distance.

10. The memory block of claim 1, wherein the memory block comprises a hierarchical bit-line architecture.

11. The memory block of claim 1, wherein the memory block is a multiple-port memory.

12. The memory block of claim 1, wherein the cells each comprise six transistors.

13. The memory block of claim 1, wherein the predetermined threshold is approximately equal to the access delay of the one of the memory cells of the array having a longest duration and not having its threshold voltage set based on its first connection distance or its second connection distance.

14. The memory block of claim 1, wherein maintenance of the access delay of the memory cell comprises one or more of a supply voltage of the memory cell, a ground voltage of the memory cell, or a back bias voltage of each of one or more transistors of the memory cell being set specifically to enable maintenance of the access delay of the memory cell.

* * * * *

UNITED STATES PATENT AND TRADEMARK OFFICE
CERTIFICATE OF CORRECTION

| | |
|---|---|
| PATENT NO. | : 7,573,775 B2 |
| APPLICATION NO. | : 11/673245 |
| DATED | : August 11, 2009 |
| INVENTOR(S) | : Farzan Fallah et al. |

It is certified that error appears in the above-identified patent and that said Letters Patent is hereby corrected as shown below:

Col. 10, Ln. 44: After "programmable" delete "away" and insert -- array --.

Signed and Sealed this

Sixteenth Day of March, 2010

David J. Kappos
*Director of the United States Patent and Trademark Office*